United States Patent
Tan et al.

(10) Patent No.: US 8,003,311 B2
(45) Date of Patent: Aug. 23, 2011

(54) INTEGRATED CIRCUIT SYSTEM EMPLOYING MULTIPLE EXPOSURE DUMMY PATTERNING TECHNOLOGY

(75) Inventors: Sia Kim Tan, Singapore (SG); Soo Muay Goh, Singapore (SG); Qunying Lin, Singapore (SG); Martin Yeo, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 855 days.

(21) Appl. No.: 11/972,809

(22) Filed: Jan. 11, 2008

(65) Prior Publication Data
US 2009/0181551 A1    Jul. 16, 2009

(51) Int. Cl.
*G03F 7/20*    (2006.01)
(52) U.S. Cl. .................. 430/396; 430/311; 430/394

(58) Field of Classification Search .................. 430/311, 430/394, 396
See application file for complete search history.

(56) References Cited

U.S. PATENT DOCUMENTS

| 5,532,090 A | 7/1996 | Borodovsky |
| 5,811,222 A | 9/1998 | Gardner et al. |
| 2005/0089765 A1* | 4/2005 | Tsai et al. ................ 430/5 |

\* cited by examiner

*Primary Examiner* — Kathleen Duda
(74) *Attorney, Agent, or Firm* — Mikio Ishimaru

(57) ABSTRACT

An integrated circuit system that includes: providing a substrate coated with a photoresist material; exposing the photoresist material to an energy source through a first mask to form a first substrate feature and a second substrate feature therein; and exposing the photoresist material to the energy source through a second mask to transform the second substrate feature into another one of the first substrate feature therein.

20 Claims, 6 Drawing Sheets

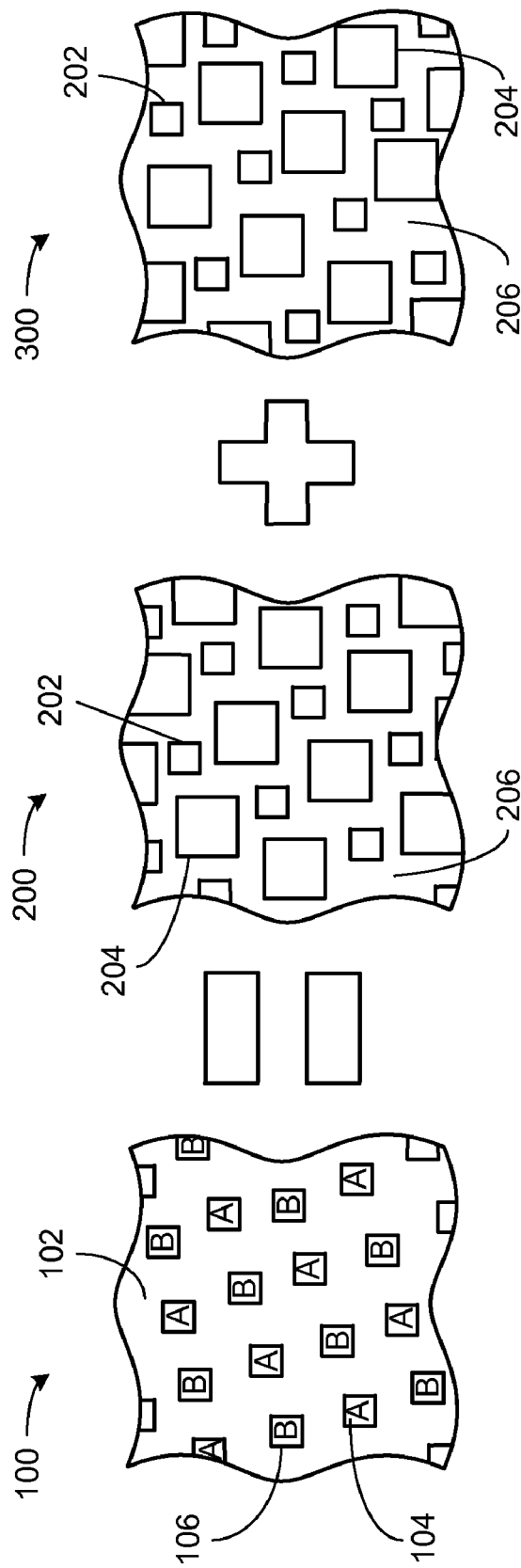

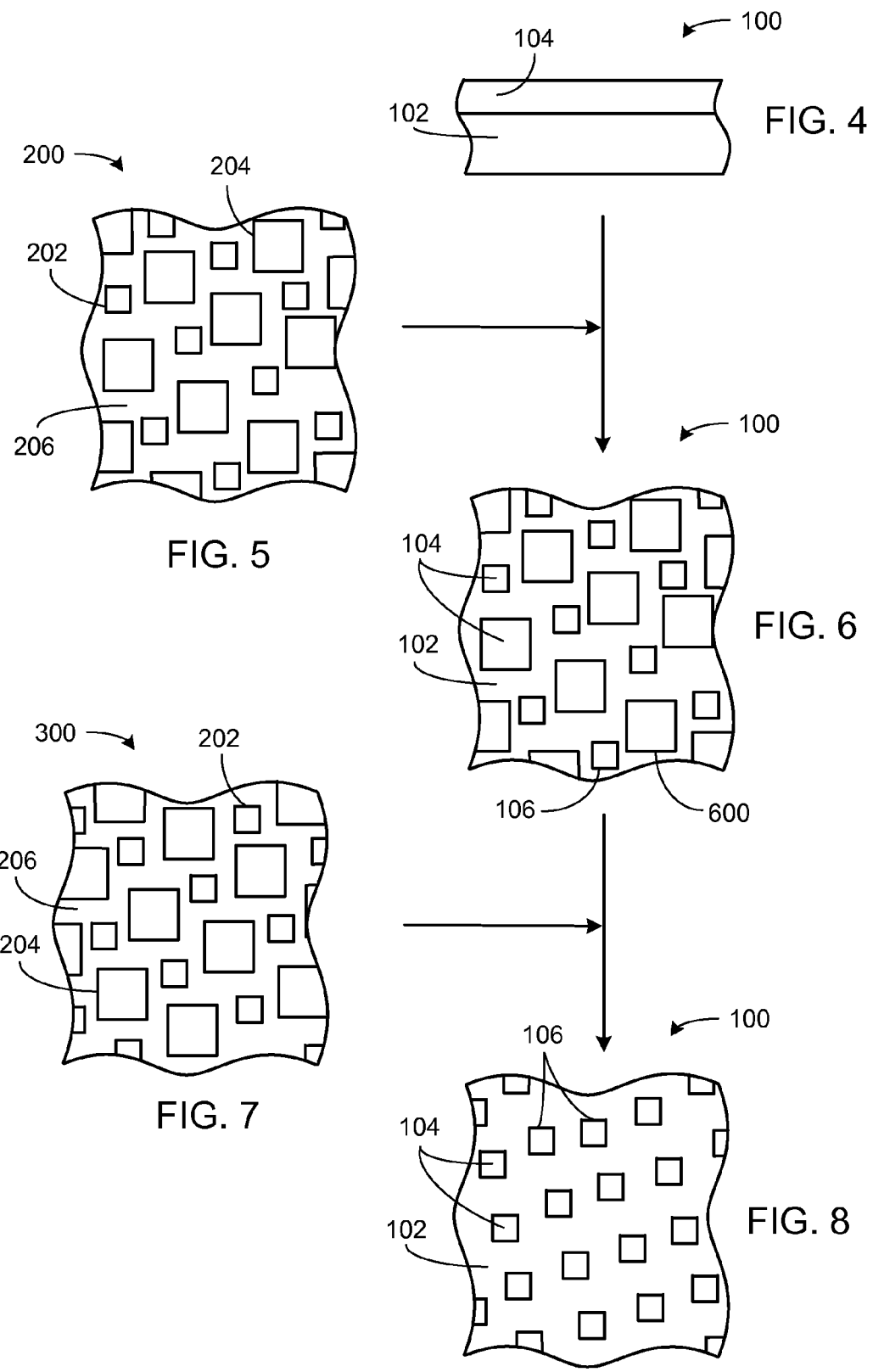

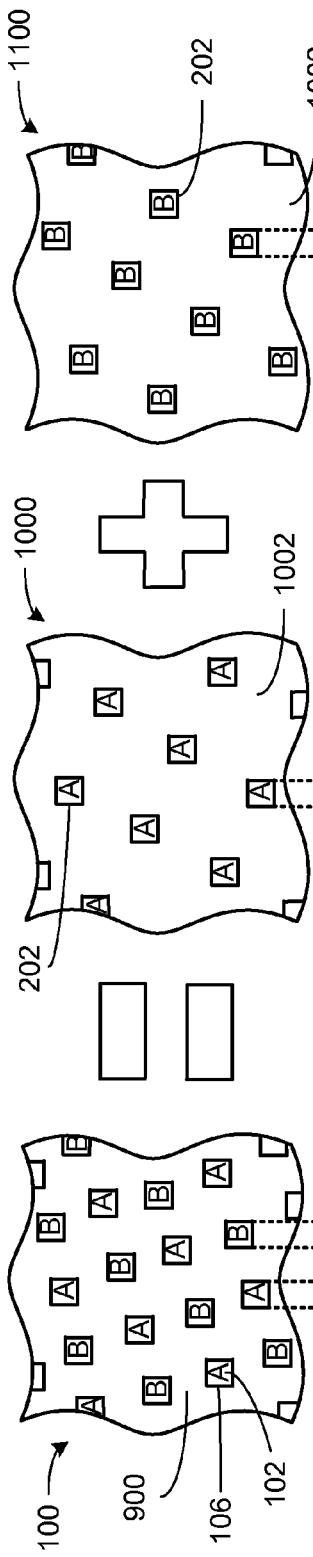
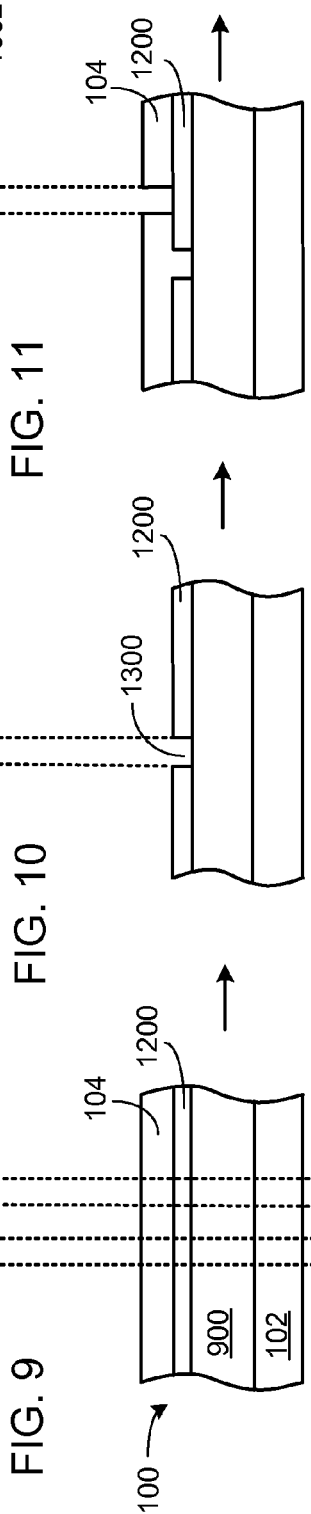
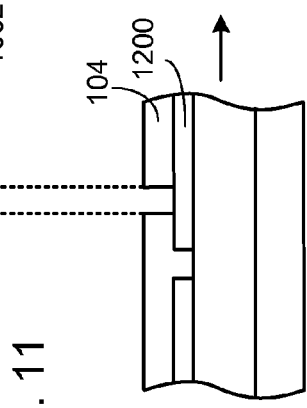
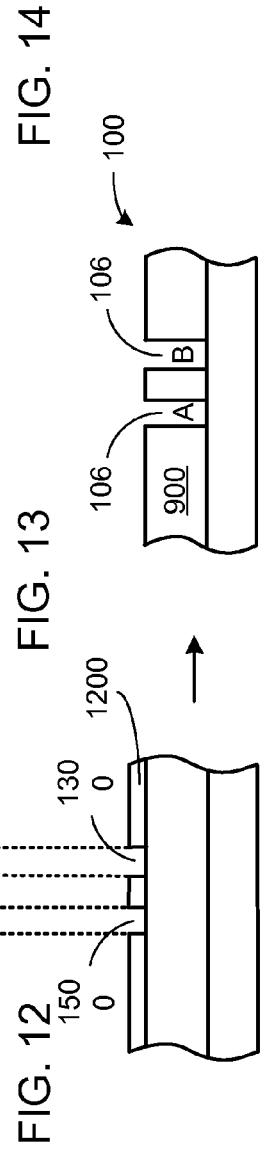

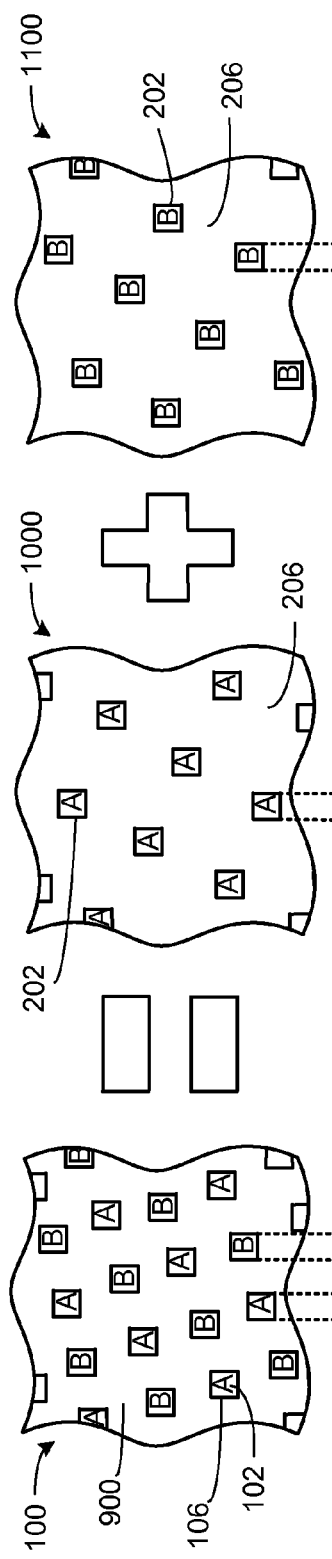
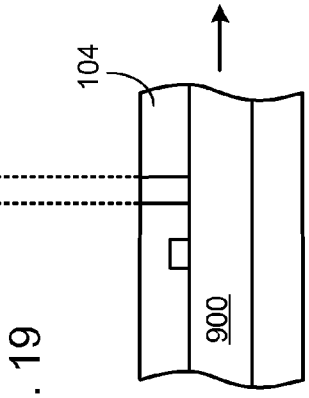
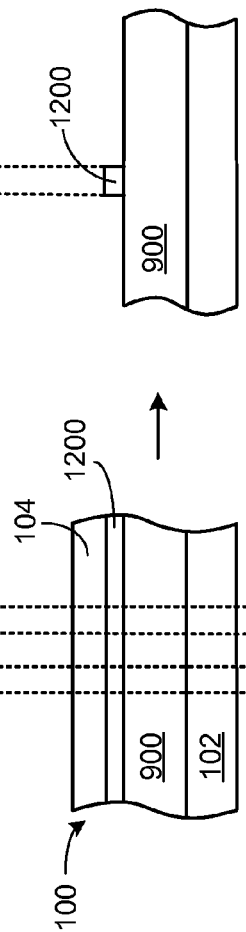
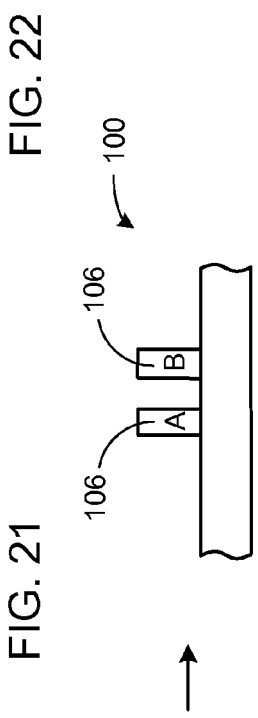
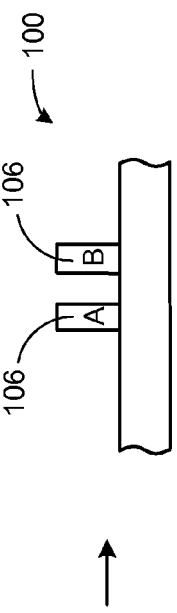
FIG. 17　FIG. 18　FIG. 19
FIG. 20　FIG. 21　FIG. 22
FIG. 23　FIG. 24

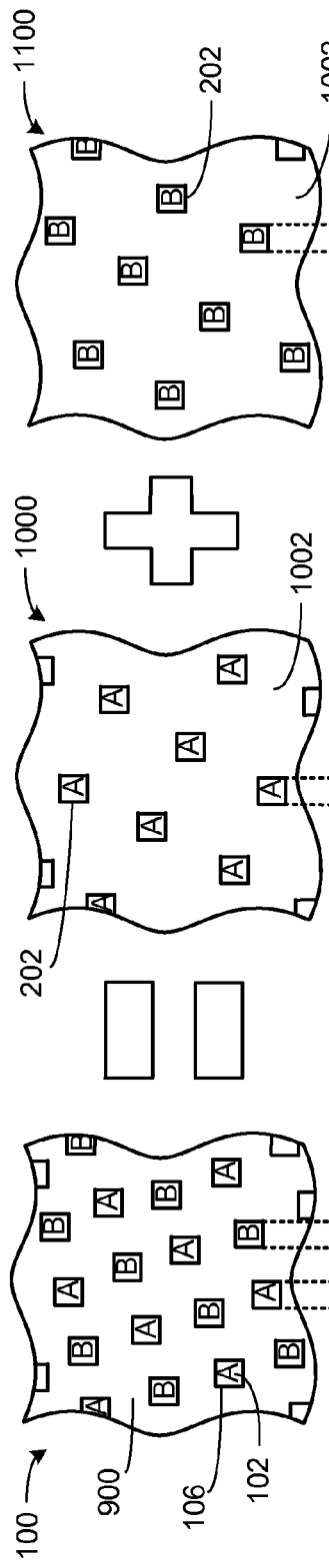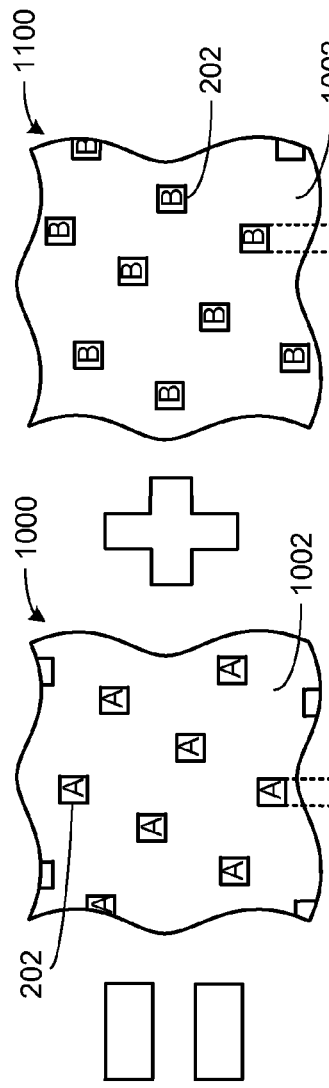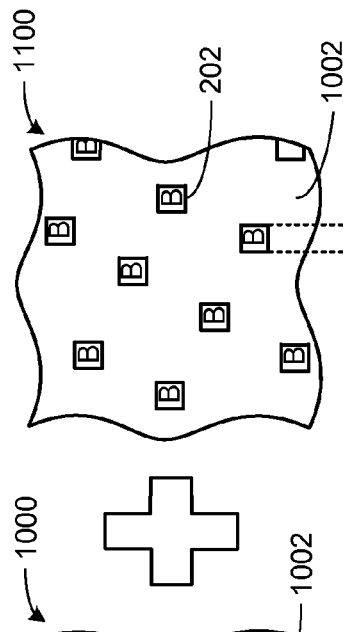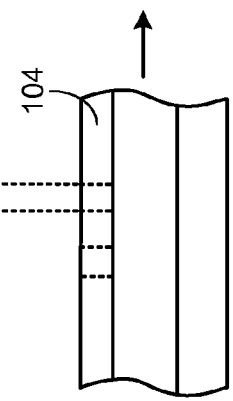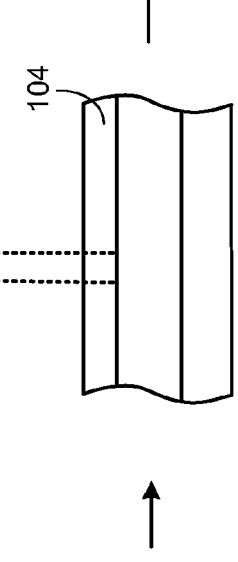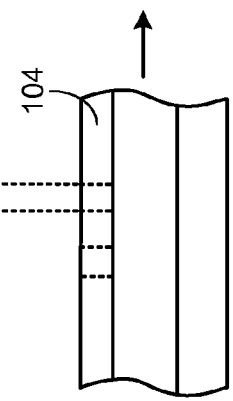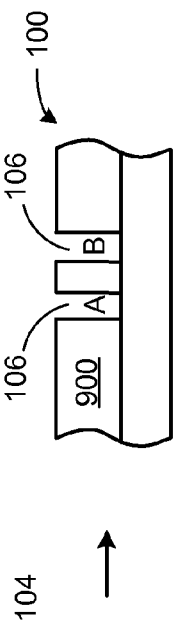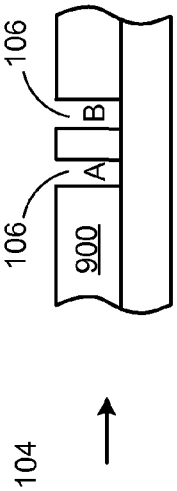

US 8,003,311 B2

INTEGRATED CIRCUIT SYSTEM EMPLOYING MULTIPLE EXPOSURE DUMMY PATTERNING TECHNOLOGY

TECHNICAL FIELD

The present invention relates generally to integrated circuits, and more particularly to an integrated circuit system employing multiple exposure dummy patterning technology.

BACKGROUND ART

Integrated circuits find application in many of today's consumer electronics, such as cell phones, video cameras, portable music players, printers, computers, etc. Integrated circuits may include a combination of active devices, passive devices and their interconnections. These integrated circuits are commonly formed by imaging multiple reticles and/or mask patterns on a wafer via a process called photolithography.

Generally, the photolithography process and its corresponding equipment consist of a light source transmitted through an optical system onto a reticle or mask with a pattern. The reticle or mask pattern produced by the light is then reduced (typically by a factor of 4 or 5) and aligned to a wafer covered with a light-sensitive photoresist, wherein the desired integrated circuit pattern is then transferred to the photoresist and subsequently to underlying layers. Unfortunately, these integrated circuit patterns tend to vary in density over the topography of a wafer, consequently leading to loading effects during etching and unwanted dishing during a chemical mechanical planarization (CMP) process.

Commonly, dummy fill patterns are generated on wafers to help reduce the density variations across the topography of a wafer. For a dummy fill pattern formed by a multiple exposure method, the dummy fill pattern will either be generated on a single mask with a large blocking layer on the other mask or by using dummy patterns on both masks. Unfortunately, the allocation of a dummy pattern on a single mask with a large blocking layer employed on the other mask will cause the mask transmission intensity to be different for each mask. This unequal mask pattern density distribution will result in different exposure doses and a different contribution to the final photoresist critical dimension (CD) by each mask, thereby affecting the desired density of the dummy fill pattern formed on the wafer. Additionally, the mask pattern density may also affect the mask writing process registration, which can cause a significant mask registration difference between each mask.

On the other hand, the allocation of a dummy pattern between two or more masks can make the process sensitive to alignment offset, thereby distorting the desired shape and affecting the desired density of the dummy fill pattern formed on the wafer. For example, alignment offset in both the X and Y directions between the first and second masks can produce a feature size that is either smaller or larger than desired, depending on whether the data polarity of the mask is clear or dark. Accordingly, the allocation of a dummy pattern between two or more masks can lead to significant variations in CD uniformity and pattern density, thereby adversely impacting the etch rate for an etch process and polish rate for a CMP process.

Thus, a need still remains for a reliable integrated circuit system and method of fabrication, wherein the integrated circuit system includes a uniform density dummy pattern formed by a multiple exposure process that helps to prevent loading and dishing. In view of the ever-increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit system including: providing a substrate coated with a photoresist material; exposing the photoresist material to an energy source through a first mask to form a first substrate feature and a second substrate feature therein; and exposing the photoresist material to the energy source through a second mask to transform the second substrate feature into another one of the first substrate feature therein.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

FIG. 1 is a top view of a portion of an integrated circuit system in accordance with an embodiment of the present invention;

FIG. 2 is a top view of a first mask in accordance with an embodiment of the present invention;

FIG. 3 is a top view of a second mask in accordance with an embodiment of the present invention;

FIG. 4 is a cross sectional view of an integrated circuit system in an initial stage of manufacture in accordance with an embodiment of the present invention;

FIG. 5 is a top view of a first mask in accordance with an embodiment of the present invention;

FIG. 6 is a top view of the structure of FIG. 4 after exposing an integrated circuit system to a first mask;

FIG. 7 is a top view of a second mask in accordance with an embodiment of the present invention;

FIG. 8 is a top view of the structure of FIG. 6 after exposing an integrated circuit system to a second mask;

FIG. 9 is a top view of a portion of an integrated circuit system in accordance with another embodiment of the present invention;

FIG. 10 is a top view of a first mask in accordance with an embodiment of the present invention;

FIG. 11 is a top view of a second mask in accordance with an embodiment of the present invention;

FIG. 12 is a cross sectional view of an integrated circuit system in an initial stage of manufacture in accordance with an embodiment of the present invention;

FIG. 13 is the structure of FIG. 12 after exposure to a first mask;

FIG. 14 is the structure of FIG. 13 after exposure to a second mask;

FIG. 15 is the structure of FIG. 14 after further processing;

FIG. 16 is the structure of FIG. 15 after etching a dielectric material;

FIG. 17 is a top view of a portion of an integrated circuit system in accordance with another embodiment of the present invention;

FIG. 18 is a top view of a first mask in accordance with an embodiment of the present invention;

FIG. 19 is a top view of a second mask in accordance with an embodiment of the present invention;

FIG. 20 is a cross sectional view of an integrated circuit system in an initial stage of manufacture in accordance with an embodiment of the present invention;

FIG. 21 is the structure of FIG. 20 after exposure to a first mask;

FIG. 22 is the structure of FIG. 21 after exposure to a second mask;

FIG. 23 is the structure of FIG. 22 after further processing;

FIG. 24 is the structure of FIG. 23 after etching a dielectric material;

FIG. 25 is a top view of a portion of an integrated circuit system in accordance with another embodiment of the present invention;

FIG. 26 is a top view of a first mask in accordance with an embodiment of the present invention;

FIG. 27 is a top view of a second mask in accordance with an embodiment of the present invention;

FIG. 28 is a cross sectional view of an integrated circuit system in an initial stage of manufacture in accordance with an embodiment of the present invention;

FIG. 29 is the structure of FIG. 28 after exposure to a first mask;

FIG. 30 is the structure of FIG. 29 after exposure to a second mask;

FIG. 31 is the structure of FIG. 30 after further processing;

FIG. 32 is the structure of FIG. 31 after etching a dielectric material;

BEST MODE FOR CARRYING OUT THE INVENTION

Figure 33:
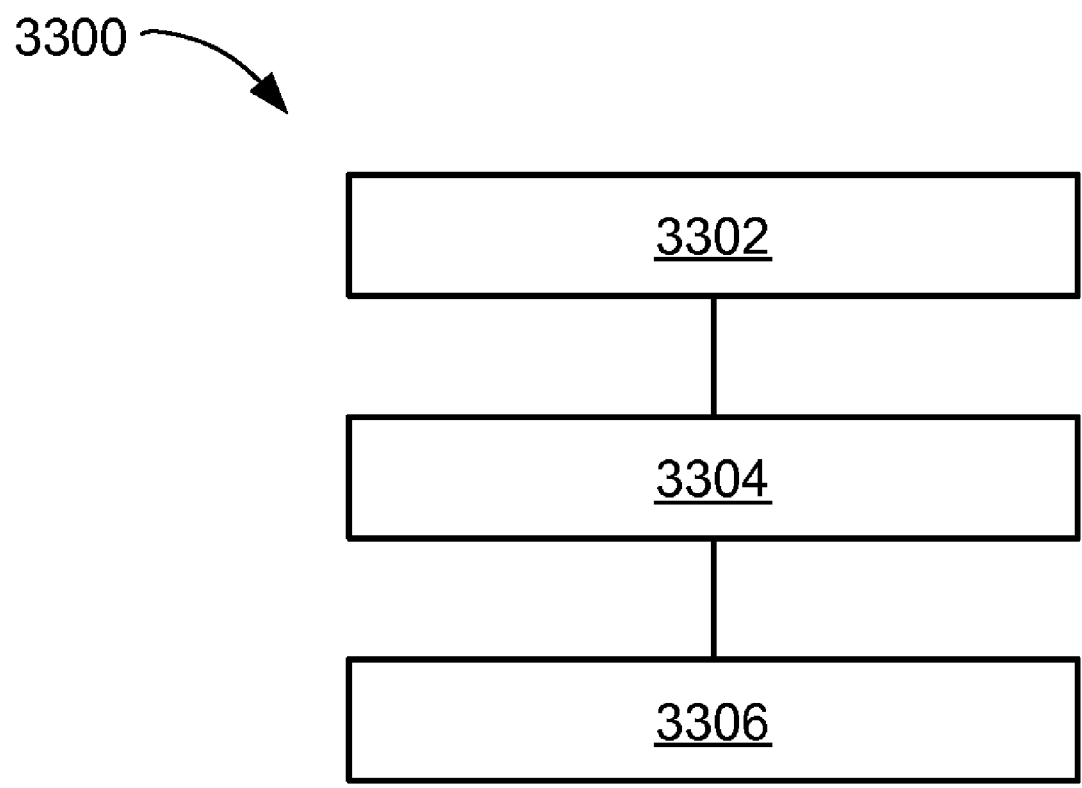
FIG. 33 is a flow chart of an integrated circuit system for an integrated circuit system, in accordance with an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGs. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material or photoresist, patterning, exposure, development, etching, cleaning, and/or removal of the material or photoresist as required in forming a described structure.

The term "on" is used herein to mean there is direct contact among elements.

The terms "example" or "exemplary" are used herein to mean serving as an instance or illustration. Any aspect or embodiment described herein as an "example" or as "exemplary" is not necessarily to be construed as preferred or advantageous over other aspects or designs.

The terms "first" and "second" as used herein are for purposes of differentiation between elements only and are not to be construed as limiting the scope of the present invention.

As will be evident from context, the term "integrated circuit system" is defined to mean the system of manufacturing an integrated circuit in accordance with the present invention and the system of the integrated circuit manufactured by using the system of manufacturing of the present invention.

Generally, the following embodiments relate to the formation of a patterned wafer with a uniform pattern density dummy structure within an integrated circuit system. The uniform pattern density dummy structure can be formed by a multiple exposure photolithography process, wherein the dummy structure pattern density on each reticle or mask (these terms are used interchangeably in this application) is substantially evenly split between all of the masks. By splitting the dummy structure pattern density substantially evenly among the masks, a substantially similar exposure dose and mask registration can be achieved. Additionally, by strategically configuring the dummy structure pattern density on each mask substantially equally, the inventors have discovered how to eliminate alignment offset problems associated with multiple exposure techniques. By employing the method and apparatus of the following embodiments, the pattern density across the topography of a wafer, or more specifically an integrated circuit system, can be strategically controlled to reduce incidences of loading and dishing.

It is to be understood that the following embodiments, FIGS. 1-32, may be used with any conventional lithography process, as well as any advanced lithography process that employs resolution enhancement techniques, such as off-axis illumination, optical proximity correction, serifs, and phase-shift masks, for example. Moreover, it is to be understood that the pattern presented on each of the masks is only part of a larger whole, which may include patterns for other structures, such as active devices, passive devices, and interconnections. Although the embodiments that follow are described in terms of a first mask and a second mask, it is to be understood that any number of masks (i.e.—two or more) may be employed and that one mask pattern need not necessarily precede that of another.

FIGS. 1-8, which follow, depict by way of example and not by limitation, an exemplary process flow for the formation of an integrated circuit system and they are not to be construed as limiting. It is to be understood that a plurality of conventional processes that are well known within the art and not repeated herein, may precede or follow FIGS. 1-8. Moreover, it is to be understood that many modifications, additions, and/or omissions may be made to the below described process without departing from the scope or spirit of the claimed subject matter. For example, the below described process may include more, fewer, or other steps. Additionally, steps may be performed in any suitable order without departing from the scope of the present invention.

Generally, and by way of example, the mask image patterns of the present embodiment, FIGS. 1-8, can be provided by projecting energy through a first mask having a first radiation transmitting pattern, and then projecting energy through a second mask having a second radiation transmitting pattern, wherein the second mask is configured by forming a second mask feature of the second mask where a first mask feature of the first mask was located and a first mask feature of the second mask where a second mask feature of the first mask was located.

Referring now to FIG. 1 therein is shown a top view of a portion of an integrated circuit system 100 in accordance with an embodiment of the present invention. In an aspect of the present embodiment, the portion of the integrated circuit system 100 depicted may represent a region strategically designated for dummy structure fabrication. By way of example, the dummy structure may include a uniform density dummy structure that helps to ameliorate loading and dishing effects due to uneven densities across the topography of a substrate. The present embodiments achieve the uniform density dummy structure by employing masks with almost substantially equivalent pattern density (e.g., the difference in pattern density between masks can range from about zero (0) to about five (5) percent).

It will be appreciated by those skilled in the art that the integrated circuit system 100 can be part of a larger whole that may include other structures, such as active devices, passive devices, and their interconnections. Moreover, it is to be understood that one or more of the integrated circuit system 100 can be prepared at one time on a substrate 102, which could then be separated into individual or multiple semiconductor assemblies at a later stage of fabrication.

The integrated circuit system 100 is formed over, on, or within the substrate 102. By way of example, the substrate 102 may include any semiconducting material, such as, Si, SiC, SiGe, Si/SiGe, SiGeC, Ge, GaAs, InAs, InP, other III/V or II/VI compound semiconductors, as well as silicon-on-insulator configurations. Additionally, the substrate 102 may also include doped and undoped configurations, strained configurations, and one or more crystal orientations (e.g.— <100>, <110>, and/or <111> orientations), which may be strategically employed to optimize carrier mobility within nFET and pFET devices. In an aspect of the present embodiment, the substrate 102 may possess a thickness ranging from about one hundred (100) nanometers to about several hundred microns, for example.

In another aspect of the present embodiment, the substrate 102 may also include an insulative layer, a metallic layer, or a combination thereof.

However, the examples provided for the substrate 102 are not to be construed as limiting and the composition of the substrate 102 may include any material, configuration, or thickness that physically and electrically enables the formation of active devices, passive devices, interconnections and dummy structures.

A photoresist material 104 can be formed over or on the substrate 102 by spin coating equipment, for example. It is to be understood that the photoresist material 104 may include any type of energy sensitive film, such as a negative tone resist, a positive tone resist or a chemically amplified resist, for example. Furthermore, it is to be understood that additional layers, such as a primer, a top anti-reflective coating, a hard mask layer, and/or a bottom anti-reflective coating may be employed to enhance the development of the photoresist material 104. Moreover, it is to be understood that the photoresist material 104 and the substrate 102 can be in direct contact or that there can be one or more intervening layers between the photoresist material 104 and the substrate 102, such as an insulative layer or a metallic layer.

As is well known in the art, the photoresist material 104 can be exposed to an energy source, such as actinic radiation, through a mask with transparent and opaque regions. The light passing through the transparent regions of the mask exposes the underlying photoresist layer and depending upon the photoresist layer composition, the exposed portions of the photoresist material 104 can either become soluble or insoluble to a subsequent developer.

In an aspect of the present embodiment, the photoresist material 104 can be patterned into a repeating array of a first substrate feature 106 with a uniform density, wherein each one of the first substrate feature 106 is substantially identically sized and shaped. Typically, the size of the first substrate feature 106 ranges from about one (1) micrometer to about twenty (20) micrometers, which is about ten to twenty times larger than a main feature size. In some embodiments, the first substrate feature 106 may include a uniform high pattern density structure wherein a 3×3 or larger array of the first substrate feature 106 is formed within a region.

It is to be understood that the pattern produced by the first substrate feature 106 is representative of a combined exposure of two or more separate masking steps. For ease of discussion, each of the first substrate feature 106 is either demarcated by the letter "A" or the letter "B" for purposes of distinguishing which of the first substrate feature 106 is sized up in the mask pattern that produced the integrated circuit system 100. For example, the integrated circuit system 100 can be formed by two separate mask exposure steps, wherein the mask patterns are essentially identical to the repeating pattern of the first substrate feature 106 on the substrate 102, except that either the first substrate feature 106 marked "A" or the first substrate feature 106 marked "B" has been enlarged on the mask. Additionally, it is to be understood that other features, not requiring multiple exposure may be present on one or more of the masks.

For ease of discussion, the remainder of the present embodiment will focus its disclosure upon the use of a positive tone resist (i.e., the photoresist material 104) for purposes of clarity.

Referring now to FIG. 2, therein is shown a top view of a first mask 200 in accordance with an embodiment of the present invention. Generally, the first mask 200 includes a first radiation transmitting pattern defined by alternately configuring a first mask feature 202 and a second mask feature 204 substantially equally spaced apart, wherein the second mask feature 204 can act as a blocking pattern. In an aspect of the present embodiment, the first mask 200 may be described as a clear field mask wherein the data polarity is dark. Per this embodiment, the first mask feature 202 and the second mask feature 204 may represent areas with chrome and a clear region 206 may represent an area without chrome.

As is evident from the disclosure, the pattern on the first mask 200 is substantially identical to the pattern formed by the first substrate feature 106 on the substrate 102, both of FIG. 1, except that each of the first substrate feature 106 marked with the letter "B" has been enlarged. Per this embodiment, the first substrate feature 106 marked with the letter "A" represents where the first mask feature 202 is formed on the first mask 200 and the first substrate feature 106 marked with the letter "B" represents where the second mask feature 204 is formed on the first mask 200.

Generally, the size of the second mask feature 204 may include any area (i.e., length multiplied by width) that does not exceed the region defined by the clear region 206 between each of the first mask feature 202. In an aspect of the present embodiment, the area of the second mask feature 204 includes an area that permits fast, repeatable, accurate and/or precise alignment of the first mask feature 202 within an area defined by the second mask feature 204. In another aspect of the present embodiment, the area of the second mask feature 204 may range from about 1.2 times to about 2 times larger than the area of the first mask feature 202.

The first mask feature 202 typically possesses an area that is substantially equal to the area of the first substrate feature 106 marked with the letter "A", but that is less than the area of the second mask feature 204. By way of example, the area of the first mask feature 202 may include an area approximately at, or slightly above or below the reliably patterned resolution limit of a photolithography apparatus. In an aspect of the present embodiment, the first mask feature 202 may include an area that ranges from about one (1) square micrometer to about four-hundred (400) square micrometers. However, the area of the first mask feature 202 is not limited to the preceding examples and may include any area that suits the design specifications of the integrated circuit system 100.

Notably, it has been discovered by the present inventors that by forming the second mask feature 204 such that the first mask feature 202 may be reliably patterned within an area defined by the second mask feature 204 during a subsequent and separate mask exposure that a much larger process latitude may be employed when forming the uniform density pattern of the first substrate feature 106, of FIG. 1.

Although the first mask feature 202 and the second mask feature 204 are depicted as square in shape, it is to be understood that the first mask feature 202 and the second mask feature 204 may include any curvilinear or rectilinear design, such as a circular, a rectangular, or a poly-sided shape.

Referring now to FIG. 3, therein is shown a top view of a second mask 300 in accordance with an embodiment of the present invention. Generally, the second mask 300 includes a second radiation transmitting pattern defined by alternately configuring the first mask feature 202 and the second mask feature 204 substantially equally spaced apart, wherein the second mask feature 204 can act as a blocking pattern for some of the first substrate feature 106, of FIG. 1, formed by previous exposures. In an aspect of the present embodiment, the second mask 300 may be described as a clear field mask wherein the data polarity is dark. Per this embodiment, the first mask feature 202 and the second mask feature 204 may represent areas with chrome and the clear region 206 may represent an area without chrome.

As is evident from the disclosure, the pattern on the second mask 300 is substantially identical to the pattern formed by the first substrate feature 106 on the substrate 102, both of FIG. 1, except that each of the first substrate feature 106 marked with the letter "A" has been enlarged. Per this embodiment, the first substrate feature 106 marked with the letter "B" represents where the first mask feature 202 is formed on the second mask 300 and the first substrate feature 106 marked with the letter "A" represents where the second mask feature 204 is formed on the second mask 300.

Generally, the size of the second mask feature 204 may include any area (i.e.—length multiplied by width) that does not exceed the region defined by the clear region 206 between each of the first mask feature 202. In an aspect of the present embodiment, the area of the second mask feature 204 includes an area that is larger than the area of the first substrate feature 106 marked with the letter "A". In another aspect of the present embodiment, the area of the second mask feature 204 may range from about 1.2 times to about 2 times larger than the area of the first mask feature 202.

By way of example, the first mask feature 202 may possess an area that is substantially equal to the area of the first substrate feature 106 marked with the letter "B", but that is less than the area of the second mask feature 204. In an aspect of the present embodiment, the area of the first mask feature 202 may include an area approximately at, or slightly above or below the reliably patterned resolution limit of a photolithography apparatus. In another aspect of the present embodiment, the first mask feature 202 may include an area that ranges from about one (1) square micrometer to about four-hundred (400) square micrometers. In yet another aspect of the present embodiment, the area of the first mask feature 202 may include an area that permits fast, repeatable, accurate and/or precise alignment of the first mask feature 202 within an area defined by the second mask feature 204.

Notably, it has been discovered by the present inventors that by forming the second mask feature 204 such that the first mask feature 202 may be reliably patterned within an area defined by the second mask feature 204 during a subsequent and separate mask exposure that a much larger process latitude may be employed when forming the uniform density pattern of the first substrate feature 106, of FIG. 1.

Although the first mask feature 202 and the second mask feature 204 are depicted as square in shape, it is to be understood that the first mask feature 202 and the second mask feature 204 may include any curvilinear or rectilinear design, such as a circular, a rectangular, or a poly-sided shape.

Referring now to FIG. 4, therein is shown a cross sectional view of the integrated circuit system 100 in an initial stage of manufacture in accordance with an embodiment of the present invention. The integrated circuit system 100 includes the substrate 102 and the photoresist material 104. The portion of the integrated circuit system 100 depicted may represent a region wherein a uniform density dummy structure is to be formed.

Referring now to FIG. 5, therein is shown a top view of the first mask 200 in accordance with an embodiment of the present invention. The first mask 200 includes the first mask feature 202, the second mask feature 204, and the clear region 206. In an aspect of the present embodiment, the integrated circuit system 100, of FIG. 4, is exposed to the first mask 200 via an energy source and produces the image pattern as depicted in FIG. 6.

Referring now to FIG. 6, therein is shown a top view of the structure of FIG. 4 after exposing the integrated circuit system 100 to the first mask 200, of FIG. 5. After exposing the integrated circuit system 100 to an energy source through the first mask 200, the exposed portions of the photoresist material 104 can be developed and stripped by processes well known in the art and not repeated herein. The integrated circuit system 100 now includes the substrate 102, the first substrate feature 106 and a second substrate feature 600. In at least one embodiment, the first substrate feature 106 and the second substrate feature 600 are separated form each other by intervening portions of the substrate 102, which are defined by the clear region 206 of the first mask 200, both of FIG. 5. It is to be understood that the first substrate feature 106 is formed by the first mask feature 202, of FIG. 5, and the second substrate feature 600 is formed by the second mask feature 204, of FIG. 5.

Referring now to FIG. 7, therein shown a top view of the second mask 300 in accordance with an embodiment of the present invention. The second mask 300 includes the first mask feature 202, the second mask feature 204, and the clear region 206. It is to be understood that the second mask feature 204 of the second mask 300 is formed over the first substrate feature 106, of FIG. 6, and the first mask feature 202 of the second mask 300 is aligned within the area defined by the second substrate feature 600, of FIG. 6. In an aspect of the present embodiment, the integrated circuit system 100, of FIG. 6, is exposed to the second mask 300 via an energy source and produces the image pattern as depicted in FIG. 8.

Referring now to FIG. 8, therein is shown a top view of the structure of FIG. 6 after exposing the integrated circuit system 100 to the second mask 300, of FIG. 7. After exposing the integrated circuit system 100 to an energy source through the second mask 300, the remaining portions of the photoresist material 104 now exposed can be developed and stripped by processes well known in the art and not repeated herein. The integrated circuit system 100 now includes the substrate 102 and the first substrate feature 106, wherein the first substrate feature 106 has replaced the second substrate feature 600, of FIG. 6. It is to be understood that the pattern created by each of the first substrate feature 106 is produced by the combined exposure of the first mask 200, of FIG. 5, and the second mask 300, of FIG. 7.

Generally, the present inventors have discovered that by splitting the image pattern to be produced on the integrated circuit system 100 onto two or more separate masks that each mask may possess an equal pattern density. Accordingly, by irradiating the integrated circuit system 100 with equal pattern density masks, the present embodiment can produce a uniform and repeatable exposure dose (e.g., a similar mask transmission for both horizontal and vertical masks) that will form a uniform density pattern within a photosensitive material. Additionally, by forming each of the masks with an equal pattern density, the present embodiment achieves similar mask registration (e.g., the residue error value of the pattern placement are matching to the previous layer). Furthermore, by performing the alternate mask feature enlargement technique of the present embodiment, the final image pattern produced on the integrated circuit system 100 is not affected by alignment offset and the concomitant CD variations associated with alignment offset.

FIGS. 9-16, which follow, depict by way of example and not by limitation, an exemplary process flow for the formation of the integrated circuit system 100 and they are not to be construed as limiting. It is to be understood that a plurality of conventional processes that are well known within the art and not repeated herein, may precede or follow FIGS. 9-16. Moreover, it is to be understood that many modifications, additions, and/or omissions may be made to the below described process without departing from the scope or spirit of the claimed subject matter. For example, the below described process may include more, fewer, or other steps. Additionally, steps may be performed in any suitable order without departing from the scope of the present invention.

Generally, and by way of example, the mask image patterns of the present embodiment can be provided by projecting an energy source through a first mask having a first radiation transmitting pattern, and then projecting an energy source through a second mask having a second radiation transmitting pattern, wherein the second mask feature 204, of FIGS. 2 and 3, has been removed from each of the masks.

Referring now to FIG. 9 therein is shown a top view of a portion of the integrated circuit system 100 in accordance with another embodiment of the present invention. In an aspect of the present embodiment, the portion of the integrated circuit system 100 depicted may represent a region strategically designated for dummy structure fabrication. By way of example, the dummy structure may include a uniform density dummy structure that helps to ameliorate loading and dishing effects due to uneven densities across the topography of a substrate. The present embodiments achieve the uniform density dummy structure by employing masks with almost substantially equivalent pattern density (e.g., the difference in pattern density between masks can range from about zero (0) to about five (5) percent).

However, it is to be understood that the integrated circuit system 100 can be part of a larger whole that may include other structures, such as active devices, passive devices, and their interconnections. Moreover, it is to be understood that one or more of the integrated circuit system 100 can be prepared at one time on the substrate 102, which could then be separated into individual or multiple semiconductor assemblies at a later stage of fabrication.

The integrated circuit system 100 is formed over, on, or within the substrate 102. By way of example, the substrate 102 may include any semiconducting material, such as, Si, SiC, SiGe, Si/SiGe, SiGeC, Ge, GaAs, InAs, InP, other III/V or II/VI compound semiconductors, as well as silicon-on-insulator configurations. Additionally, the substrate 102 may also include doped and undoped configurations, strained configurations, and one or more crystal orientations (e.g.— <100>, <110>, and/or <111> orientations), which may be strategically employed to optimize carrier mobility within nFET and pFET devices. In an aspect of the present embodiment, the substrate 102 may possess a thickness ranging from about one hundred (100) nanometers to about several hundred microns, for example.

However, the examples provided for the substrate 102 are not to be construed as limiting and the composition of the substrate 102 may include any material, configuration, or thickness that physically and electrically enables the formation of active devices, passive devices, interconnections and dummy structures.

Per the present embodiment, the dielectric material 900, such as an oxide, a nitride, or various other well known low-k or high-k dielectric constant materials, has been patterned into a repeating array of the first substrate feature 106 with a uniform density, wherein each one of the first substrate feature 106 is substantially identically sized and shaped. Typically, the size of the first substrate feature 106 may range from about one (1) micrometer to about twenty (20) micrometers, which is about ten to twenty times larger than a main feature size. In another aspect of the present embodiment, the first substrate feature 106 may include a uniform high pattern density structure wherein a 3×3 or larger array of the first substrate feature 106 is formed within a region.

It is to be understood that the pattern produced by the first substrate feature 106 is representative of a combined exposure of two or more separate masking steps. For ease of discussion, each of the first substrate feature 106 is either demarcated by the letter "A" or the letter "B" for purposes of distinguishing which of the first substrate feature 106 is produced by the separate masking steps. For example, the integrated circuit system 100 can be formed by two separate mask exposure steps, wherein the masks patterns are essentially identical to the repeating pattern of the first substrate feature 106 on the substrate 102, except that either the first substrate feature 106 marked "A" or the first substrate feature 106 marked "B" has been removed. Additionally, it is to be understood that other features, not requiring multiple exposure may be present on one or more of the masks.

Referring now to FIG. 10, therein is shown a top view of the first mask 1000 in accordance with an embodiment of the present invention. Generally, the first mask 1000 includes a first radiation transmitting pattern defined by an array of the first mask feature 202 substantially equally spaced apart. In an aspect of the present embodiment, the first mask 1000 may be described as a dark field mask wherein the data polarity is clear. Per this embodiment, the first mask feature 202 may represent an area without chrome and an opaque region 1002 may represent an area with chrome.

As is evident from the disclosure, the pattern on the first mask 1000 is substantially identical to the pattern formed by the first substrate feature 106 within the dielectric material 900, both of FIG. 9, except that each of the first substrate feature 106 marked with the letter "B" has been removed from the first mask 1000. Per this embodiment, the first substrate feature 106 marked with the letter "A" represents where the first mask feature 202 is formed on the first mask 1000 and the first substrate feature 106 marked with the letter "B" represents a structure to be formed by a subsequent processing step (i.e.—the opaque region 1002 on the first mask 1000). Stated another way, the first mask 1000 is the same as the first mask 200, of FIG. 2, except that the second mask feature 204, of FIG. 2, has been removed.

Generally, the first mask feature 202 possesses an area (i.e., length multiplied by width) that is substantially equal to the area of the first substrate feature 106 marked with the letter "A". By way of example, the size of the first mask feature 202 may include an area approximately at, or slightly above or below the reliably patterned resolution limit of a photolithography apparatus. In an aspect of the present embodiment, the first mask feature 202 may include an area that ranges from about 0.5 square micrometers to about 400 square micrometers. However, the area of the first mask feature 202 is not limited to the preceding examples and may include any area that suits the design specifications of the integrated circuit system 100.

Although the first mask feature 202 is depicted as square in shape, it is to be understood that the first mask feature 202 may include any curvilinear or rectilinear design, such as a circular, a rectangular, or a poly-sided shape.

Referring now to FIG. 11, therein is shown a top view of a second mask 1100 in accordance with an embodiment of the present invention. Generally, the second mask 1100 includes a second radiation transmitting pattern defined by an array of the first mask feature 202 substantially equally spaced apart. In an aspect of the present embodiment, the second mask 1100 may be described as a dark field mask wherein the data polarity is clear. Per this embodiment, the first mask feature 202 may represent an area without chrome and the opaque region 1002 may represent an area with chrome.

As is evident from the disclosure, the pattern on the second mask 1100 is substantially identical to the pattern formed by the first substrate feature 106 on the substrate 102, both of FIG. 9, except that each of the first substrate feature 106 marked with the letter "A" has been removed from the second mask 1100. Per this embodiment, the first substrate feature 106 marked with the letter "B" represents where the first mask feature 202 is formed on the second mask 1100 and the first substrate feature 106 marked with the letter "A" represents a structure previously formed (i.e.—the opaque region 1002 on the second mask 1100). Stated another way, the second mask 1100 is the same as the second mask 300, of FIG. 3, except that the second mask feature 204, of FIG. 3, has been removed.

Generally, the first mask feature 202 possesses an area (i.e., length multiplied by width) that is substantially equal to the area of the first substrate feature 106 marked with the letter "B". By way of example, the size of the first mask feature 202 may include an area approximately at, or slightly above or below the reliably patterned resolution limit of a photolithography apparatus. In an aspect of the present embodiment, the first mask feature 202 may include an area that ranges from about 0.5 square micrometers to about 400 square micrometers. However, the area of the first mask feature 202 is not limited to the preceding examples and may include any area that suits the design specifications of the integrated circuit system 100.

Although the first mask feature 202 is depicted as square in shape, it is to be understood that the first mask feature 202 may include any curvilinear or rectilinear design, such as a circular, a rectangular, or a poly-sided shape.

Referring now to FIG. 12 therein is shown a cross sectional view of the integrated circuit system 100 in an initial stage of manufacture in accordance with an embodiment of the present invention. The integrated circuit system 100 includes the substrate 102, the dielectric material 900, a hard mask material 1200 such as silicon nitride, and the photoresist material 104. The portion of the integrated circuit system 100 depicted may represent a region wherein a uniform density dummy structure is to be formed.

Per the present embodiment, the photoresist material 104 can be formed over or on the hard mask material 1200 by spin coating equipment, for example. It is to be understood that the photoresist material 104 may include any type of energy sensitive film, such as a negative tone resist, a positive tone resist or a chemically amplified resist, for example. Further, it is to be understood that additional layers, such as a primer, a top anti-reflective coating, and/or a bottom anti-reflective coating may be employed to enhance the development of the photoresist material 104.

As is well known in the art, the photoresist material 104 can be exposed to an energy source, such as actinic radiation, through a mask with transparent and opaque regions. The light passing through the transparent regions of the mask exposes the underlying photoresist layer and depending upon the photoresist layer composition, the exposed portions of the photoresist material 104 can either become soluble or insoluble to a subsequent developer.

For ease of discussion, the remainder of the present embodiment will focus its disclosure upon the use of a positive tone resist (i.e.—the photoresist material 104) for purposes of clarity.

Referring now to FIG. 13, therein is shown the structure of FIG. 12 after exposure to the first mask 1000, of FIG. 10. It is to be understood that the first mask feature 202, of FIG. 10, of the first mask 1000 corresponds to a first opening 1300 and the first substrate feature 106, of FIG. 9, demarcated with the letter "A". Per this embodiment, the photoresist material 104, of FIG. 12, has been exposed and developed, thereby allowing the hard mask material 1200 to be etched to form the first opening 1300. After etching, the photoresist material 104 can be removed by processes well known in the art and not repeated herein.

Referring now to FIG. 14, therein is shown the structure of FIG. 13 after exposure to the second mask 1100, of FIG. 11. Per this embodiment, another layer of the photoresist material 104 has been deposited, exposed and developed to allow etching of the hard mask material 1200 in FIG. 15. It is to be understood that the first mask feature 202, of FIG. 11, of the second mask 1100 corresponds to the first substrate feature 106, of FIG. 9, demarcated with the letter "B".

Referring now to FIG. 15, therein is shown the structure of FIG. 14 after further processing. Per this embodiment, the hard mask material 1200 has been etched to form a second opening 1500 within the hard mask material 1200 adjacent the first opening 1300. After forming the second opening 1500, the photoresist material 104, of FIG. 14, can be removed. It is to be understood that the second opening 1500 corresponds with the first mask feature 202 of the second mask, both of FIG. 11.

Referring now to FIG. 16, therein is shown the structure of FIG. 15 after etching the dielectric material 900. The hard mask material 1200, of FIG. 15, can be used to etch the first substrate feature 106 within the dielectric material 900. After etching each of the first substrate feature 106, the hard mask material 1200 can be removed by processes well known within the art.

Generally, it is to be understood that by splitting the image pattern to be produced on the integrated circuit system 100 onto two or more separate masks that each mask may possess an equal pattern density. More specifically, it has been discovered by the present inventors that removing the second mask feature 204, of FIGS. 2 and 3, from both of the first mask 1000, of FIG. 10, and the second mask 1100, of FIG. 11, that the resulting mask pattern for each mask is of equal pattern density. Accordingly, by irradiating the integrated circuit system 100 with equal pattern density masks, the present embodiment can produce a uniform and repeatable exposure dose (e.g.—a similar mask transmission for both horizontal and vertical masks) that will form a uniform pattern within a photosensitive material. Additionally, by forming each of the masks with an equal pattern density, the present embodiment achieves similar mask registration (e.g., the residue error value of the pattern placement are matching to the previous layer). Furthermore, by removing the second mask feature 204, of FIGS. 2 and 3, from each of the first mask 1000, of FIG. 10, and the second mask 1100, of FIG. 11, the final image pattern produced on the integrated circuit system 100 is not affected by alignment offset and the concomitant CD variations associated with alignment offset.

FIGS. 17-24, which follow, depict by way of example and not by limitation, an exemplary process flow for the formation of the integrated circuit system 100 and they are not to be construed as limiting. It is to be understood that a plurality of conventional processes that are well known within the art and not repeated herein, may precede or follow FIGS. 17-24. Moreover, it is to be understood that many modifications, additions, and/or omissions may be made to the below described process without departing from the scope or spirit of the claimed subject matter. For example, the below described process may include more, fewer, or other steps. Additionally, steps may be performed in any suitable order without departing from the scope of the present invention.

Generally, and by way of example, the mask image patterns of the present embodiment can be provided by projecting an energy source through a first mask having a first radiation transmitting pattern, and then projecting an energy source through a second mask having a second radiation transmitting pattern, wherein the second mask feature 204, of FIGS. 2 and 3, has been removed from each of the masks.

Referring now to FIG. 17 therein is shown a top view of a portion of the integrated circuit system 100 in accordance with another embodiment of the present invention. In an aspect of the present embodiment, the portion of the integrated circuit system 100 depicted may represent a region strategically designated for dummy structure fabrication. By way of example, the dummy structure may include a uniform density dummy structure that helps to ameliorate loading and dishing effects due to uneven densities across the topography of a substrate. The present embodiments achieve the uniform density dummy structure by employing masks with almost substantially equivalent pattern density (e.g., the difference in pattern density between masks can range from about zero (0) to about five (5) percent).

However, it is to be understood that the integrated circuit system 100 can be part of a larger whole that may include other structures, such as active devices, passive devices, and their interconnections. Moreover, it is to be understood that one or more of the integrated circuit system 100 can be prepared at one time on the substrate 102, which could then be separated into individual or multiple semiconductor assemblies at a later stage of fabrication.

The integrated circuit system 100 is formed over, on, or within the substrate 102. By way of example, the substrate 102 may include any semiconducting material, such as, Si, SiC, SiGe, Si/SiGe, SiGeC, Ge, GaAs, InAs, InP, other III/V or II/VI compound semiconductors, as well as silicon-on-insulator configurations. Additionally, the substrate 102 may also include doped and undoped configurations, strained configurations, and one or more crystal orientations (e.g.— <100>, <110>, and/or <111> orientations), which may be strategically employed to optimize carrier mobility within nFET and pFET devices. In an aspect of the present embodiment, the substrate 102 may possess a thickness ranging from about one hundred (100) nanometers to about several hundred microns, for example.

However, the examples provided for the substrate 102 are not to be construed as limiting and the composition of the substrate 102 may include any material, configuration, or thickness that physically and electrically enables the formation of active devices, passive devices, interconnections and dummy structures.

Per the present embodiment, a dielectric material 900, such as an oxide, a nitride, or various other well known low-k or high-k dielectric constant materials, has been patterned into a repeating array of the first substrate feature 106 with a uniform density, wherein each one of the first substrate feature 106 is substantially identically sized and shaped. Typically, the size of the first substrate feature 106 ranges from about one (1) micrometer to about twenty (20) micrometers, which is about ten to twenty times larger than a main feature size. In some embodiments, the first substrate feature 106 may include a uniform high pattern density structure wherein a 3×3 or larger array of the first substrate feature 106 is formed within a region.

It is to be understood that the pattern produced by the first substrate feature 106 is representative of a combined exposure of two or more separate masking steps. For ease of discussion, each of the first substrate feature 106 is either demarcated by the letter "A" or the letter "B" for purposes of distinguishing which of the first substrate feature 106 is produced by the separate masking steps. For example, the integrated circuit system 100 can be formed by two separate mask exposure steps, wherein the masks patterns are essentially identical to the repeating pattern of the first substrate feature 106 on the substrate 102, except that either the first substrate feature 106 marked "A" or the first substrate feature 106 marked "B" has been removed. Additionally, it is to be understood that other features, not requiring multiple exposure may be present on one or more of the masks.

Referring now to FIG. 18, therein is shown a top view of the first mask 1000 in accordance with an embodiment of the present invention. Generally, the first mask 1000 includes a first radiation transmitting pattern defined by an array of the first mask feature 202 substantially equally spaced apart. In an aspect of the present embodiment, the first mask 1000 may be described as a clear field mask wherein the data polarity is dark. Per this embodiment, the first mask feature 202 may represent an area with chrome and the clear region 206 may represent an area without chrome.

As is evident from the disclosure, the pattern on the first mask 1000 is substantially identical to the pattern formed by the first substrate feature 106 within the dielectric material 900, both of FIG. 17, except that each of the first substrate feature 106 marked with the letter "B" has been removed from the first mask 1000. Per this embodiment, the first substrate feature 106 marked with the letter "A" represents where the first mask feature 202 is formed on the first mask 1000 and the first substrate feature 106 marked with the letter "B" represents a structure to be formed by a subsequent processing step (i.e.—the clear region 206 on the first mask 1000). Stated another way, the first mask 1000 is the same as the first mask 200, of FIG. 2, except that the second mask feature 204, of FIG. 2, has been removed.

Generally, the first mask feature 202 possesses an area (i.e., length multiplied by width) that is substantially equal to the area of the first substrate feature 106 marked with the letter "A". By way of example, the size of the first mask feature 202 may include an area approximately at, or slightly above or below the reliably patterned resolution limit of a photolithography apparatus. In an aspect of the present embodiment, the first mask feature 202 may include an area that ranges from about 0.5 square micrometers to about 400 square micrometers. However, the area of the first mask feature 202 is not limited to the preceding examples and may include any area that suits the design specifications of the integrated circuit system 100.

Although the first mask feature 202 is depicted as square in shape, it is to be understood that the first mask feature 202 may include any curvilinear or rectilinear design, such as a circular, a rectangular, or a poly-sided shape.

Referring now to FIG. 19, therein is shown a top view of the second mask 1100 in accordance with an embodiment of the present invention. Generally, the second mask 1100 includes a second radiation transmitting pattern defined by an array of the first mask feature 202 substantially equally spaced apart. In an aspect of the present embodiment, the second mask 1100 may be described as a clear field mask wherein the data polarity is dark. Per this embodiment, the first mask feature 202 may represent an area with chrome and the clear region 206 may represent an area without chrome.

As is evident from the disclosure, the pattern on the second mask 1100 is substantially identical to the pattern formed by the first substrate feature 106 on the substrate 102, both of FIG. 17, except that each of the first substrate feature 106 marked with the letter "A" has been removed from the second mask 1100. Per this embodiment, the first substrate feature 106 marked with the letter "B" represents where the first mask feature 202 is formed on the second mask 1100 and the first substrate feature 106 marked with the letter "A" represents a structure previously formed (i.e.—the clear region 206 on the second mask 1100). Stated another way, the second mask 1100 is the same as the second mask 300, of FIG. 3, except that the second mask feature 204, of FIG. 3, has been removed.

Generally, the first mask feature 202 possesses an area (i.e. length multiplied by width) that is substantially equal to the area of the first substrate feature 106 marked with the letter "B". By way of example, the size of the first mask feature 202 may include an area approximately at, or slightly above or below the reliably patterned resolution limit of a photolithography apparatus. In an aspect of the present embodiment, the first mask feature 202 may include an area that ranges from about 0.5 square micrometers to about 400 square micrometers. However, the area of the first mask feature 202 is not limited to the preceding examples and may include any area that suits the design specifications of the integrated circuit system 100.

Although the first mask feature 202 is depicted as square in shape, it is to be understood that the first mask feature 202 may include any curvilinear or rectilinear design, such as a circular, a rectangular, or a poly-sided shape.

Referring now to FIG. 20 therein is shown a cross sectional view of the integrated circuit system 100 in an initial stage of manufacture in accordance with an embodiment of the present invention. The integrated circuit system 100 includes the substrate 102, the dielectric material 900, the hard mask material 1200 such as silicon nitride, and the photoresist material 104. The portion of the integrated circuit system 100 depicted may represent a region wherein a uniform density dummy structure is to be formed.

Per the present embodiment, the photoresist material 104 can be formed over or on the hard mask material 1200 by spin coating equipment, for example. It is to be understood that the photoresist material 104 may include any type of energy sensitive film, such as a negative tone resist, a positive tone resist or a chemically amplified resist, for example. Further, it is to be understood that additional layers, such as a primer, a top anti-reflective coating, and/or a bottom anti-reflective coating may be employed to enhance the development of the photoresist material 104.

As is well known in the art, the photoresist material 104 can be exposed to an energy source, such as actinic radiation, through a mask with transparent and opaque regions. The light passing through the transparent regions of the mask exposes the underlying photoresist layer and depending upon the photoresist layer composition, the exposed portions of the photoresist material 104 can either become soluble or insoluble to a subsequent developer.

For ease of discussion, the remainder of the present embodiment will focus its disclosure upon the use of a positive tone resist (i.e.—the photoresist material 104) for purposes of clarity.

Referring now to FIG. 21, therein is shown the structure of FIG. 20 after exposure to the first mask 1000, of FIG. 18. It is to be understood that the first mask feature 202, of FIG. 18, of the first mask 1000 corresponds to the first substrate feature 106, of FIG. 17, demarcated with the letter "A". Per this embodiment, the photoresist material 104, of FIG. 20, has been exposed and developed, thereby removing the portions of the photoresist material 104 exposed to the energy source and allowing the hard mask material 1200 to be etched. After etching the hard mask material 1200, the photoresist material 104 can be removed leaving a portion of the hard mask material 1200, now representing the pattern produced by the first mask 1000, intact over the dielectric material 900.

Referring now to FIG. 22, therein is shown the structure of FIG. 21 after exposure to the second mask 1100, of FIG. 19. Per this embodiment, another layer of the photoresist material 104 has been deposited and exposed to allow a portion of the photoresist material 104 now representing the pattern produced by the second mask 1100 to remain intact over the dielectric material 900. It is to be understood that the first mask feature 202, of FIG. 19, of the second mask 1100 corresponds to the first substrate feature 106, of FIG. 17, demarcated with the letter "B".

Referring now to FIG. 23, therein is shown the structure of FIG. 22 after further processing. Per this embodiment, the portion of the photoresist material 104 exposed to the energy source has been removed, thereby leaving the portion of the photoresist material 104 now representing the pattern produced by the second mask 1100, of FIG. 19, to remain intact over the dielectric material 900.

Referring now to FIG. 24, therein is shown the structure of FIG. 23 after etching the dielectric material 900, of FIG. 23. The hard mask material 1200, of FIG. 21, and the photoresist material 104, of FIG. 23, can be used to form the first substrate feature 106 within/from the dielectric material 900. After forming the first substrate feature 106, the hard mask material 1200 and the photoresist material 104 can be removed by processes well known within the art.

Generally, it is to be understood that by splitting the image pattern to be produced on the integrated circuit system 100 onto two or more separate masks that each mask may possess an equal pattern density. More specifically, it has been discovered by the present inventors that removing the second mask feature 204, of FIGS. 2 and 3, from both of the first mask 1000, of FIG. 18, and the second mask 1100, of FIG. 19, that the resulting mask pattern for each mask is of equal pattern density. Accordingly, by irradiating the integrated circuit system 100 with equal pattern density masks, the present embodiment can produce a uniform and repeatable exposure dose (e.g., a similar mask transmission for both horizontal and vertical masks) that will form a uniform pattern within a photosensitive material. Additionally, by forming each of the masks with an equal pattern density, the present embodiment achieves similar mask registration (e.g., the residue error value of the pattern placement are matching to the previous layer). Furthermore, by removing the second mask feature 204, of FIGS. 2 and 3, from each of the first mask 1000, of FIG. 18, and the second mask 1100, of FIG. 19, the final image pattern produced on the integrated circuit system 100 is not affected by alignment offset and the concomitant CD variations associated with alignment offset.

FIGS. 25-32, which follow, depict by way of example and not by limitation, an exemplary process flow for the formation of the integrated circuit system 100 and they are not to be construed as limiting. It is to be understood that a plurality of conventional processes that are well known within the art and not repeated herein, may precede or follow FIGS. 25-32. Moreover, it is to be understood that many modifications, additions, and/or omissions may be made to the below described process without departing from the scope or spirit of the claimed subject matter. For example, the below described process may include more, fewer, or other steps. Additionally, steps may be performed in any suitable order without departing from the scope of the present invention.

Generally, and by way of example, the mask image patterns of the present embodiment can be provided by projecting an energy source through a first mask having a first radiation transmitting pattern, and then projecting an energy source through a second mask having a second radiation transmitting pattern, wherein the second mask feature 204, of FIGS. 2 and 3, has been removed from each of the masks.

Referring now to FIG. 25 therein is shown a top view of a portion of the integrated circuit system 100 in accordance with another embodiment of the present invention. In an aspect of the present embodiment, the portion of the integrated circuit system 100 depicted may represent a region strategically designated for dummy structure fabrication. By way of example, the dummy structure may include a uniform density dummy structure that helps to ameliorate loading and dishing effects due to uneven densities across the topography of a substrate. The present embodiments achieve the uniform density dummy structure by employing masks with almost substantially equivalent pattern density (e.g., the difference in pattern density between masks can range from about zero (0) to about five (5) percent).

However, it is to be understood that the integrated circuit system 100 can be part of a larger whole that may include other structures, such as active devices, passive devices, and their interconnections. Moreover, it is to be understood that one or more of the integrated circuit system 100 can be prepared at one time on the substrate 102, which could then be separated into individual or multiple semiconductor assemblies at a later stage of fabrication.

The integrated circuit system 100 is formed over, on, or within the substrate 102. By way of example, the substrate 102 may include any semiconducting material, such as, Si, SiC, SiGe, Si/SiGe, SiGeC, Ge, GaAs, InAs, InP, other III/V or II/VI compound semiconductors, as well as silicon-on-insulator configurations. Additionally, the substrate 102 may also include doped and undoped configurations, strained configurations, and one or more crystal orientations (e.g.— <100>, <110>, and/or <111> orientations), which may be strategically employed to optimize carrier mobility within nFET and pFET devices. In an aspect of the present embodiment, the substrate 102 may possess a thickness ranging from about one hundred (100) nanometers to about several hundred microns, for example.

However, the examples provided for the substrate 102 are not to be construed as limiting and the composition of the substrate 102 may include any material, configuration, or thickness that physically and electrically enables the formation of active devices, passive devices, interconnections and dummy structures.

Per the present embodiment, the dielectric material 900, such as an oxide, a nitride, or various other well known low-k or high-k dielectric constant materials, has been patterned into a repeating array of the first substrate feature 106 with a uniform density, wherein each one of the first substrate feature 106 is substantially identically sized and shaped. Typically, the size of the first substrate feature 106 ranges from about one (1) micrometer to about twenty (20) micrometers, which is about ten to twenty times larger than a main feature size. In some embodiments, the first substrate feature 106 may include a uniform high pattern density structure wherein a 3×3 or larger array of the first substrate feature 106 is formed within a region.

It is to be understood that the pattern produced by the first substrate feature 106 is representative of a combined exposure of two or more separate masking steps. For ease of discussion, each of the first substrate feature 106 is either demarcated by the letter "A" or the letter "B" for purposes of distinguishing which of the first substrate feature 106 is produced by the separate masking steps. For example, the integrated circuit system 100 can be formed by two separate mask exposure steps, wherein the masks patterns are essentially identical to the repeating pattern of the first substrate feature 106 on the substrate 102, except that either the first substrate feature 106 marked "A" or the first substrate feature 106 marked "B" has been removed. Additionally, it is to be understood that other features, not requiring multiple exposure may be present on one or more of the masks.

Referring now to FIG. 26, therein is shown a top view of the first mask 1000 in accordance with an embodiment of the present invention. Generally, the first mask 1000 includes a first radiation transmitting pattern defined by an array of the first mask feature 202 substantially equally spaced apart. In an aspect of the present embodiment, the first mask 1000 may be described as a dark field mask wherein the data polarity is clear. Per this embodiment, the first mask feature 202 may represent an area without chrome and the opaque region 1002 may represent an area with chrome.

As is evident from the disclosure, the pattern on the first mask 1000 is substantially identical to the pattern formed by the first substrate feature 106 within the dielectric material 900, both of FIG. 25, except that each of the first substrate feature 106 marked with the letter "B" has been removed from the first mask 1000. Per this embodiment, the first substrate feature 106 marked with the letter "A" represents where the first mask feature 202 is formed on the first mask 1000 and the first substrate feature 106 marked with the letter "B" represents a structure to be formed by a subsequent processing step (i.e.—the opaque region 1002 on the first mask 1000). Stated another way, the first mask 1000 is the same as the first mask 200, of FIG. 2, except that the second mask feature 204, of FIG. 2, has been removed.

Generally, the first mask feature 202 possesses an area (i.e., length multiplied by width) that is substantially equal to the area of the first substrate feature 106 marked with the letter "A". By way of example, the size of the first mask feature 202 may include an area approximately at, or slightly above or below the reliably patterned resolution limit of a photolithography apparatus. In an aspect of the present embodiment, the first mask feature 202 may include an area that ranges from about 0.5 square micrometers to about 400 square micrometers. However, the area of the first mask feature 202 is not limited to the preceding examples and may include any area that suits the design specifications of the integrated circuit system 100.

Although the first mask feature 202 is depicted as square in shape, it is to be understood that the first mask feature 202 may include any curvilinear or rectilinear design, such as a circular, a rectangular, or a poly-sided shape.

Referring now to FIG. 27, therein is shown a top view of the second mask 1100 in accordance with an embodiment of the present invention. Generally, the second mask 1100 includes a second radiation transmitting pattern defined by an array of the first mask feature 202 substantially equally spaced apart. In an aspect of the present embodiment, the second mask 1100 may be described as a dark field mask wherein the data polarity is clear. Per this embodiment, the first mask feature 202 may represent an area without chrome and the opaque region 1002 may represent an area with chrome.

As is evident from the disclosure, the pattern on the second mask 1100 is substantially identical to the pattern formed by the first substrate feature 106 on the substrate 102, both of FIG. 25, except that each of the first substrate feature 106 marked with the letter "A" has been removed from the second mask 1100. Per this embodiment, the first substrate feature 106 marked with the letter "B" represents where the first mask feature 202 is formed on the second mask 1100 and the first substrate feature 106 marked with the letter "A" represents a structure previously formed (i.e.—the opaque region 1002 on the second mask 1100). Stated another way, the second mask 1100 is the same as the second mask 300, of FIG. 3, except that the second mask feature 204, of FIG. 3, has been removed.

Generally, the first mask feature 202 possesses an area (i.e., length multiplied by width) that is substantially equal to the area of the first substrate feature 106 marked with the letter "B". By way of example, the size of the first mask feature 202 may include an area approximately at, or slightly above or below the reliably patterned resolution limit of a photolithography apparatus. In an aspect of the present embodiment, the first mask feature 202 may include an area that ranges from about 0.5 square micrometers to about 400 square micrometers. However, the area of the first mask feature 202 is not limited to the preceding examples and may include any area that suits the design specifications of the integrated circuit system 100.

Although the first mask feature 202 is depicted as square in shape, it is to be understood that the first mask feature 202 may include any curvilinear or rectilinear design, such as a circular, a rectangular, or a poly-sided shape.

Referring now to FIG. 28 therein is shown a cross sectional view of the integrated circuit system 100 in an initial stage of manufacture in accordance with an embodiment of the present invention. The integrated circuit system 100 includes the substrate 102, the dielectric material 900 and the photoresist material 104. The portion of the integrated circuit system 100 depicted may represent a region wherein a uniform density dummy structure is to be formed.

Per the present embodiment, the photoresist material 104 can be formed over or on the dielectric material 900 by spin coating equipment, for example. It is to be understood that the photoresist material 104 may include any type of energy sensitive film, such as a negative tone resist, a positive tone resist or a chemically amplified resist, for example. Further, it is to be understood that additional layers, such as a primer, a top anti-reflective coating, a hard mask layer, and/or a bottom anti-reflective coating may be employed to enhance the development of the photoresist material 104.

As is well known in the art, the photoresist material 104 can be exposed to an energy source, such as actinic radiation, through a mask with transparent and opaque regions. The light passing through the transparent regions of the mask exposes the underlying photoresist layer and depending upon the photoresist layer composition, the exposed portions of the photoresist material 104 can either become soluble or insoluble to a subsequent developer.

For ease of discussion, the remainder of the present embodiment will focus its disclosure upon the use of a positive tone resist (i.e.—the photoresist material 104) for purposes of clarity.

Referring now to FIG. 29, therein is shown the structure of FIG. 28 after exposure to the first mask 1000, of FIG. 26. It is to be understood that the first mask feature 202, of FIG. 26, of the first mask 1000 corresponds to the first substrate feature 106, of FIG. 25, demarcated with the letter "A". Per this embodiment, a portion (demarcated by dashed lines) of the photoresist material 104 has been exposed to an energy source, and that portion of the photoresist material 104 now represents the pattern produced by the first mask 1000. By way of example, the portion of the photoresist material 104 exposed to the energy source (i.e.—the regions of the photoresist material 104 bounded by the first mask feature 202) may become soluble to a developer in a subsequent processing step.

Referring now to FIG. 30, therein is shown the structure of FIG. 29 after exposure to the second mask 1100, of FIG. 27. It is to be understood that the first mask feature 202, of FIG. 27, of the second mask 1100 corresponds to the first substrate feature 106, of FIG. 25, demarcated with the letter "B". Per this embodiment, another portion (demarcated by dashed lines) of the photoresist material 104 has been exposed to an energy source, and that portion of the photoresist material 104 now represents the pattern produced by the second mask 1100. By way of example, the portion of the photoresist material 104 exposed to the energy source (i.e., the regions of the photoresist material 104 bounded by the first mask feature 202) may become soluble to a developer in a subsequent processing step. In an aspect of the present embodiment, the photoresist material 104 does not undergo a development step in between the first mask 1000, of FIG. 26, exposure step and the second mask 1100 exposure step.

Referring now to FIG. 31, therein is shown the structure of FIG. 30 after further processing. Per this embodiment, the photoresist material 104 has been developed to form a photoresist opening 3100. It is to be understood that the photoresist opening 3100 is representative of the first mask feature 202, of FIGS. 26 and 27, formed by the combined exposure of the first mask 1000, of FIG. 26, and the second mask 1100, of FIG. 27.

Referring now to FIG. 32, therein is shown the structure of FIG. 31 after etching the dielectric material 900. The photoresist material 104, of FIG. 31, is used to etch the first substrate feature 106 within the dielectric material 900. After etching each of the first substrate feature 106, the photoresist material 104 can be removed by processes well known within the art.

Generally, it is to be understood that by splitting the image pattern to be produced on the integrated circuit system 100 onto two or more separate masks that each mask may possess an equal pattern density. More specifically, it has been discovered by the present inventors that removing the second mask feature 204, of FIGS. 2 and 3, from both of the first mask 1000, of FIG. 26, and the second mask 1100, of FIG. 27, that the resulting mask pattern for each mask is of equal pattern density. Accordingly, by irradiating the integrated circuit system 100 with equal pattern density masks, the present embodiment can produce a uniform and repeatable exposure dose (e.g., a similar mask transmission for both horizontal and vertical masks) that will form a uniform pattern within a photosensitive material. Additionally, by forming each of the masks with an equal pattern density, the present embodiment achieves similar mask registration (e.g., the residue error value of the pattern placement are matching to the previous layer). Furthermore, by removing the second mask feature 204, of FIGS. 2 and 3, from each of the first mask 1000, of FIG. 26, and the second mask 1100, of FIG. 27, the final image pattern produced on the integrated circuit system 100 is not affected by alignment offset and the concomitant CD variations associated with alignment offset.

Referring now to FIG. 33, therein is shown a flow chart of an integrated circuit system 3300 for the integrated circuit system 100, in accordance with an embodiment of the present invention. The integrated circuit system 3300 includes providing a substrate coated with a photoresist material in a block 3302; exposing the photoresist material to an energy source through a first mask to form a first substrate feature and a second substrate feature therein in a block 3304; and exposing the photoresist material to the energy source through a second mask to transform the second substrate feature into another one of the first substrate feature therein in a block 3306.

It has been discovered that the present invention thus has numerous aspects. One such aspect is that the present invention reduces the occurrence of loading and dishing by forming a uniform density dummy structure via masks that transmit a substantially similar exposure dose, due to their substantially equal pattern densities.

Another aspect of the present invention is that it reduces the occurrence of alignment offset.

Another aspect of the present invention is that by enhancing the uniform density of a dummy structure, the signal for end point detection during an etching process becomes easier to detect.

Another aspect of the present invention is that the uniform density of the pattern between each of the masks helps the etching process in the mask masking as well as the wafer process etching. The present invention achieves this objective because each of the masks possesses a similar mask pattern density, which allows the mask etching process parameter settings, such as electrical current, gas flow rate and time, to be the same and no further tuning of the parameters is required for the second mask to be etched.

Another aspect of the present invention is that it helps to create a uniform pattern density so as to reduce isolated and dense structure CD differences due to loading.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit system of the present invention furnishes important and heretofore unknown and unavailable solutions, capabilities, and functional aspects for a uniform density dummy fill pattern that helps to prevent loading and dishing. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacture of an integrated circuit system comprising:
   providing a substrate with a photoresist material;
   exposing the photoresist material to an energy source through a first mask to form a first substrate feature and a second substrate feature therein, the first substrate feature separated from the second substrate feature; and
   exposing the photoresist material to the energy source through a second mask to transform the second substrate feature into another one of the first substrate feature therein.

2. The method as claimed in claim 1 wherein:
   exposing the photoresist material to an energy source through the first mask and the second mask forms a pattern for a dummy region.

3. The method as claimed in claim 1 wherein:
   exposing the photoresist material to an energy source through the first mask includes providing the first mask with a repeating pattern of a first mask feature and a second mask feature.

4. The method as claimed in claim 3 wherein:
   exposing the photoresist material to an energy source through the second mask includes providing the second mask with a repeating pattern of the first mask feature and the second mask feature.

5. The method as claimed in claim 4 further comprising:
   aligning the first mask feature of the second mask within an area defined by the second substrate feature produced by the second mask feature of the first mask.

6. A method of manufacture of an integrated circuit system comprising:
   providing a substrate coated with a photoresist material;
   exposing the photoresist material to an energy source through a first mask with a first mask feature and a second mask feature, the first mask feature separated from the second mask feature;
   configuring a second mask by forming the second mask feature of the second mask where the first mask feature of the first mask was located and the first mask feature of the second mask where the second mask feature of the first mask was located; and exposing the photoresist material to an energy source through the second mask.

7. The method as claimed in claim 6 wherein:
exposing the photoresist material to an energy source through the second mask includes aligning the first mask feature of the second mask within an area defined by a second substrate feature.

8. The method as claimed in claim 6 wherein:
providing the substrate coated with the photoresist material includes providing a positive tone photosensitive material.

9. The method as claimed in claim 6 further comprising:
configuring the first mask and the second mask with an equal pattern density.

10. The method as claimed in claim 6 further comprising:
configuring the first mask feature and the second mask feature to include a data polarity that is dark.

11. A method of manufacture of an integrated circuit system comprising:
providing a substrate including a dummy region coated with a photoresist material;
exposing the photoresist material to an energy source through a first mask with a first mask feature and a second mask feature to form a first substrate feature and a second substrate feature therein, the first substrate feature separated from the second substrate feature;
configuring a second mask by forming the second mask feature of the second mask where the first mask feature of the first mask was located and the first mask feature of the second mask where the second mask feature of the first mask was located; and
exposing the photoresist material to the energy source through the second mask to transform the second substrate feature into another one of the first substrate feature therein.

12. The method as claimed in claim 11 wherein:
providing the substrate including the dummy region coated with the photoresist material includes providing a positive tone photosensitive material.

13. The method as claimed in claim 11 wherein:
exposing the photoresist material to the energy source through the second mask includes aligning the first mask feature of the second mask within an area defined by the second substrate feature.

14. The method as claimed in claim 11 wherein:
exposing the photoresist material to the energy source through the second mask forms a repeating array of the first substrate feature.

15. The method as claimed in claim 11 further comprising:
configuring the first mask and the second mask with an equal pattern density.

16. The method as claimed in claim 11 further comprising:
configuring the first mask feature to include an area that is less than the area of the second mask feature.

17. The method as claimed in claim 11 further comprising:
configuring the first mask feature and the second mask feature to include a data polarity that is dark.

18. The method as claimed in claim 11 further comprising:
configuring the first mask feature and the second mask feature to include a curvilinear or rectilinear shape.

19. The method as claimed in claim 11 further comprising:
configuring the size of the second mask feature to include an area that does not exceed the region defined by a clear region between each of the first mask feature.

20. The method as claimed in claim 11 further comprising:
configuring the size of the first mask feature to include an area that is substantially equal to the area of the first substrate feature.

* * * * *